US009254540B2

(12) United States Patent
Hara et al.

(10) Patent No.: US 9,254,540 B2
(45) Date of Patent: Feb. 9, 2016

(54) MOUNTING STRUCTURE OF MOVABLE MANUFACTURING DEVICE, FIXING STRUCTURE AND MOVABLE MANUFACTURING DEVICE

(71) Applicants: NATIONAL INSTITUTE OF ADVANCED INDUSTRIAL SCIENCE AND TECHNOLOGY, Tokyo (JP); DESIGN NETWORK CO., LTD., Tokyo (JP)

(72) Inventors: Shiro Hara, Tsukuba (JP); Shizuka Nakano, Tsukuba (JP); Hitoshi Maekawa, Tsukuba (JP); Shinji Futagawa, Tokyo (JP); Takahiro Fukuda, Tokyo (JP)

(73) Assignees: NATIONAL INSTITUTE OF ADVANCED INDUSTRIAL SCIENCE AND TECHNOLOGY, Tokyo (JP); DESIGN NETWORK CO., LTD., Tokyo (JP)

( * ) Notice: Subject to any disclaimer, the term of this patent is extended or adjusted under 35 U.S.C. 154(b) by 0 days.

(21) Appl. No.: 14/292,125

(22) Filed: May 30, 2014

(65) Prior Publication Data

US 2014/0263938 A1    Sep. 18, 2014

Related U.S. Application Data

(63) Continuation-in-part of application No. PCT/JP2012/081037, filed on Nov. 30, 2012.

(30) Foreign Application Priority Data

Dec. 1, 2011  (JP) ................................. 2011-263161

(51) Int. Cl.
*F16M 9/00* (2006.01)
*B23Q 1/01* (2006.01)
(Continued)

(52) U.S. Cl.
CPC ... *B23Q 1/01* (2013.01); *B62B 3/06* (2013.01); *B62B 5/063* (2013.01); *F16M 11/20* (2013.01); *H01L 21/67775* (2013.01); *B62B 2203/28* (2013.01)

(58) Field of Classification Search
CPC ...... H01L 21/67775; B23Q 1/01; B62B 3/06; B62B 2203/28
USPC .............. 248/677, 678, 188.1, 673, 680, 681, 248/346.04; 280/43.12, 43.17; 254/2 C, 2 B
See application file for complete search history.

(56) References Cited

U.S. PATENT DOCUMENTS 5,354,080 A * 10/1994 Jones ......................... 280/43.12
5,690,311 A * 11/1997 Leighton et al. .............. 248/681
(Continued)

FOREIGN PATENT DOCUMENTS

JP          7-94375       4/1995
JP       2009-164307      7/2009

OTHER PUBLICATIONS

Mr. Hisakazu Mukai, 21 Seikigata Seisan System 'Minimal Manufacturing no Soshutsu', Nanotech Japan Bulletin, Aug. 3, 2009, No. 2, pp. 7-8 (Translation of p. 7-4 is provided).
(Continued)

*Primary Examiner* — Anita M King
(74) *Attorney, Agent, or Firm* — Staas & Halsey LLP

(57) ABSTRACT

Mounting structure to allow a production line made up of movable manufacturing devices to be rearranged quickly, safely, and reliably. The mounting structure according to the present invention includes a fixing structure installed on a floor and a leg portion installed on a bottom plate of the movable manufacturing device. The fixing structure comprises a floor side positioning member and a floor side coupling member while the leg portion comprises a leg side positioning member and a leg side coupling member. The floor side positioning member and the leg side positioning member positions the movable manufacturing device accurately by fitting each other when the device is placed at the specified location of the fixing structure. The floor side coupling member and the leg side coupling member fixes the movable manufacturing device located on the fixing structure by coupling each other.

17 Claims, 20 Drawing Sheets

(51) Int. Cl.
*F16M 11/20* (2006.01)
*B62B 5/06* (2006.01)
*H01L 21/677* (2006.01)
*B62B 3/06* (2006.01)

(56) References Cited

U.S. PATENT DOCUMENTS

| | | | | |
|---|---|---|---|---|
| 6,082,956 | A | * | 7/2000 | Pentland ........................ 414/495 |
| 6,345,874 | B2 | * | 2/2002 | Duong et al. ............... 312/351.1 |
| 8,727,300 | B2 | * | 5/2014 | Maier et al. .................... 248/674 |
| 2005/0127265 | A1 | * | 6/2005 | Giovinazzi .................... 248/673 |
| 2009/0168036 | A1 | | 7/2009 | Hara et al. |

OTHER PUBLICATIONS

Semiconductor Production System and Minimal Fabrication Initiative, The Third Minimal Manufacturing Symposium, National Institute of Advanced Industrial Science and Technology (AIST), Feb. 23, 2009, pp. 65-74. Translation of portion labeled "13 Development of Tightly Closed Carrier System which Makes It Possible to Manufacture ICs by Jean-Wearing Workers (Starts from Apr. 2008)", on p. 72, presented by Mr. Shiro Nara of AIST.

H. Mukai, "21 Seikigata Seisan System 'Minimal Manufacturing no Soshutsu", *Nanotech Japan Bulletion*, Aug. 3, 2009, vol. 2, No. 2, pp. 7-1 to 7-8.

International Search Report mailed Dec. 25, 2012 in corresponding International Patent Application No. PCT/JP2012/081037.

* cited by examiner

FIG.12
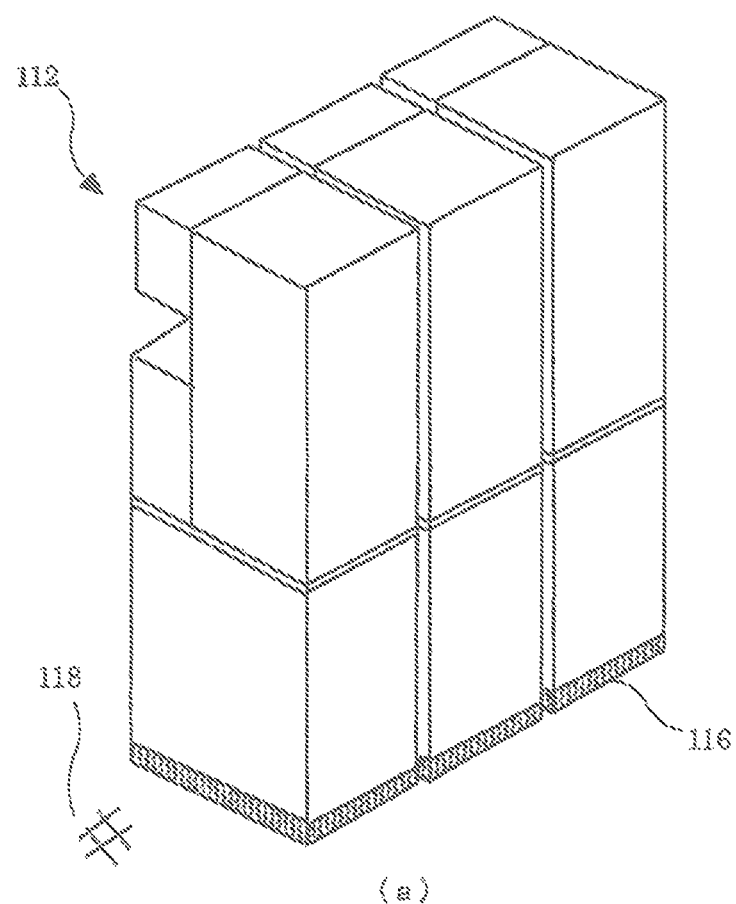
(a)
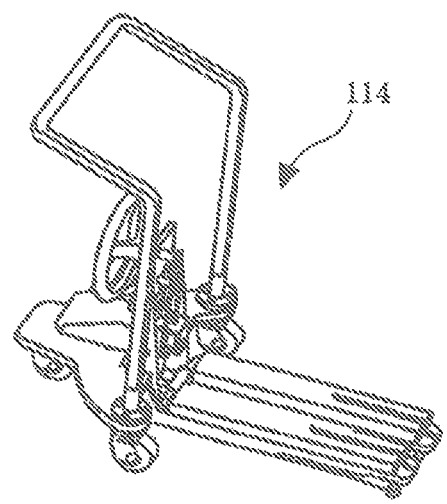
(b)

MOUNTING STRUCTURE OF MOVABLE MANUFACTURING DEVICE, FIXING STRUCTURE AND MOVABLE MANUFACTURING DEVICE

CROSS-REFERENCE TO RELATED APPLICATIONS

This is a Continuation-In-Part of Application No. PCT/JP 2012/081037 filed on Nov. 30, 2012, which claims benefit of Japanese Patent Application No. 2011-263161 filed on Dec. 1, 2011. This application is related to Japanese Patent Application No. 2012-264850, filed Dec. 4, 2012, although foreign priority is not claimed to Japanese Patent Application No. 2012-264850.

TECHNICAL FIELD

The present invention relates to a mounting structure of movable manufacturing device, a floor mount fixing structure, and a movable manufacturing device which enable quick, efficient, safe and reliable construction and changeover operations of production lines suitable for manufacture and the like of devices.

BACKGROUND ART

Minimal fabrication is a kind of fabrication system which includes one or more movable manufacturing devices.

Minimal fabrication has been attracting attention as a low-cost, energy-saving manufacturing method for high-mix, low-volume production or low-volume, high-variety production of semiconductor devices. A minimal manufacturing device is a unit which handles one process such as exposure, etching, or cleaning of semiconductor devices on a production line during minimal fabrication. A minimal fabrication production line is built by laying out the minimal manufacturing devices which undertake necessary processes, in the order of manufacturing processes. The latest studies on minimal fabrication are described, for example, in Non Patent Literature of "Semiconductor Production System and Minimal Fabrication Initiative" presented in "The Third Minimal Manufacturing Symposium" by Shiro Hara from The National Institute of Advanced Industrial Science and Technology on Feb. 23, 2009.

Known conventional techniques have problems to be solved such as described below.

If the layout of minimal manufacturing devices established for production of one product is changed, a production line for another product is set up. Changing a production line involves the operation of lifting and moving the minimal manufacturing devices and putting down and fixing them in other places. However, a minimal manufacturing device which is tall in relation to its base area is unstable. Also, to make it easier to convey parts and products between processes, it is necessary to reduce spacing between adjacent minimal manufacturing devices and place the minimal manufacturing devices accurately.

To solve the above problems, an object of the present invention is to provide a mounting structure of movable manufacturing device suitable for quick movement as well as for safe and reliable transport and fixing. Another object of the present invention is to provide a floor mount fixing structure for use to fix the minimal manufacturing device to a floor, and a movable manufacturing device fixed on the floor count fixing structure.

SUMMARY OF INVENTION

Each of the following configurations is a means of solving the above problems.

A mounting structure of movable manufacturing device according to the present invention comprises; A fixing structure which is installed on a floor to mount the movable manufacturing device, A leg portion which is installed on a bottom plate of the movable manufacturing device to be placed on the fixing structure, A positioning mechanism which determines a placing position of the leg portion using a floor side positioning member equipped by the fixing structure and a leg side positioning member equipped by the leg portion, when the leg portion is placed on the fixing portion, A coupling mechanism which prevents the movable manufacturing device from falling, by coupling the leg portion with the fixing structure, using a floor side coupling member equipped by the fixing structure and leg side coupling member equipped by the leg portion, after the leg portion is placed on the fixing portion.

A fixing structure installed on a floor to mount a movable manufacturing device according to the present invention comprises; a floor side positioning member which positions a leg side positioning member equipped by the leg portion to determine a placing position of the leg portion, when the movable manufacturing device is put down, and a floor side coupling member which prevents the movable manufacturing device from falling, by coupling with a leg side coupling member equipped by the leg portion to make the leg portion be coupled with the fixing structure, when the leg portion is placed on the fixing portion.

A movable manufacturing device according to the present invention comprises a bottom portion of which is provided with a leg portion, wherein a leg side positioning member which is positioned by floor side positioning member equipped by the leg portion to determine a placing position of the leg portion, when the movable manufacturing device is put down, and a leg side coupling member which prevents the movable manufacturing device from falling, by coupling with a floor side coupling member equipped by the fixing structure to make the leg portion be coupled with the fixing structure, when the leg portion is placed on the fixing portion.

BRIEF DESCRIPTION OF DRAWINGS

In FIG. 12, (a) is a perspective view schematically showing a production line on which minimal manufacturing devices are laid out, according to second embodiment, and (b) is a perspective view of the transport machine.

DESCRIPTION OF THE PREFERRED EMBODIMENTS

First Embodiment

Preferred embodiments of the present invention will be described in detail below on an example-by-example basis. Hereinafter, the embodiments of the present invention are described with taking examples of cases that minimal fabrication devices are employed as the movable fabrication devices of the present invention. However, it is clear that the present invention can be applied to other type of fabrication system using movable fabrication device.

First Embodiment
(Schematic Configuration)

Figure 1:
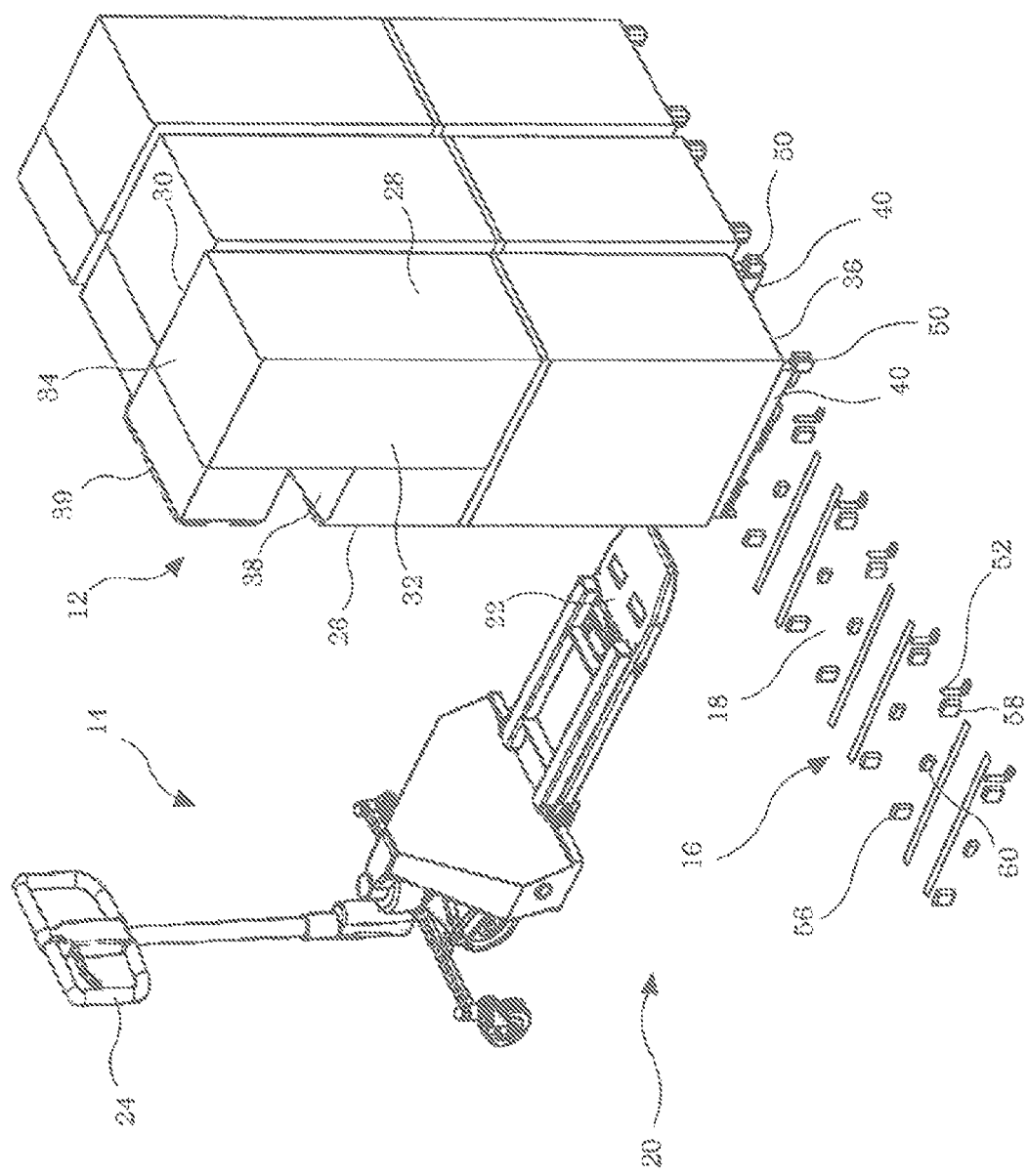
FIG. 1 is a perspective view schematically showing a production line on which minimal manufacturing devices according to the present invention are laid out, according to first embodiment.

FIG. 1 is a perspective view schematically showing a production line 20 on which minimal manufacturing devices 12 according to a first embodiment of the present invention are laid out.

According to the present embodiment, as shown in FIG. 1, the minimal manufacturing devices 12 are transported by a special-purpose transport machine 14 and laid out on a floor 18 equipped with predetermined fixing structures 16. By combining the minimal manufacturing devices 12 for a necessary number of processes, the production line 20 is implemented. For example, an automated transfer mechanism such as a robot arm (not shown) is used to convey materials and products among the minimal manufacturing devices 12.

As shown in FIG. 1, the minimal manufacturing device 12 is shaped to be tall in relation to its base area. Thus, the minimal manufacturing device 12 is unstable, as it is, with respect to vibrations/shocks. Fall prevention measures need to be taken both during transport and after installation. The transport machine 14 in FIG. 1 has the functions to lift and securely hold the minimal manufacturing device 12 on an arm 22, transport the minimal manufacturing device 12 through operation of a handle 24, and lower the minimal manufacturing device 12 accurately onto the floor 18. Also, the fixing structure 16 has a function to fix the minimal manufacturing device 12 accurately and reliably to the floor 18. To make layout changes of a large number of minimal manufacturing devices 12 in a short time, both the transport machine 14 and fixing structure 16 have constructions with good operability.

Adjacent minimal manufacturing devices 12 are arranged at minimum spacing. For example, in a space with a width of approximately 30 centimeters, one minimal manufacturing device 12 is placed at a spacing of about 5 millimeters to 1 centimeters from adjacent devices. By providing the spacing, each minimal manufacturing device 12 can be replaced freely without affecting the other devices. Also, if the devices are placed densely at narrow spacing, factory space can be utilized effectively. Furthermore, parts and products can be transported easily from process to process allowing a conveyor to be downsized.

The production line 20 using the minimal manufacturing devices 12 is characterized by being able to be rearranged freely and easily. To rearrange the production line 20, the transport machine 14 lifts each minimal manufacturing device 12 from the floor 18, transports the device to a desired location, and then accurately positions and fixes the device to the floor 18. The transport machine according to the present embodiment is equipped with a function to carry out this operation easily and simply. Also, the transport machine is equipped with a high-accuracy support mechanism adapted to prevent collisions with the adjacent minimal manufacturing devices 12 during positioning on the floor 18 and installation/removal operation.

(Minimal Manufacturing Device)

As shown in FIG. 1, the minimal manufacturing device 12 is surrounded by a front wall 26, rear wall 28, left side wall 30, and right side wall 32. A top and bottom are protected by a top plate 34 and bottom plate 36, respectively. A deck 38 and a control panel 39 are installed on the front wall 26, where the deck 38 is intended to receive the workpiece from a preceding process and send out the workpiece to the succeeding process while the control panel 39 is intended to control and monitor the operation of the devices.

The minimal manufacturing device 12 contains, for example, mechanisms for taking in semiconductor wafers from a pack received onto the deck 38 and performing one of cleaning, exposure, resist coating, development, and other fabrication processes.

As shown in FIG. 1, a pair of legs 40 are installed in parallel in those portions of the bottom plate 36 of the minimal manufacturing device 12 which are located right under the left side wall 30 and right side wall 32. The arm 22 of the transport machine 14 is inserted into a space sandwiched between the pair of legs 40 right under the bottom plate 36.

Figure 2:
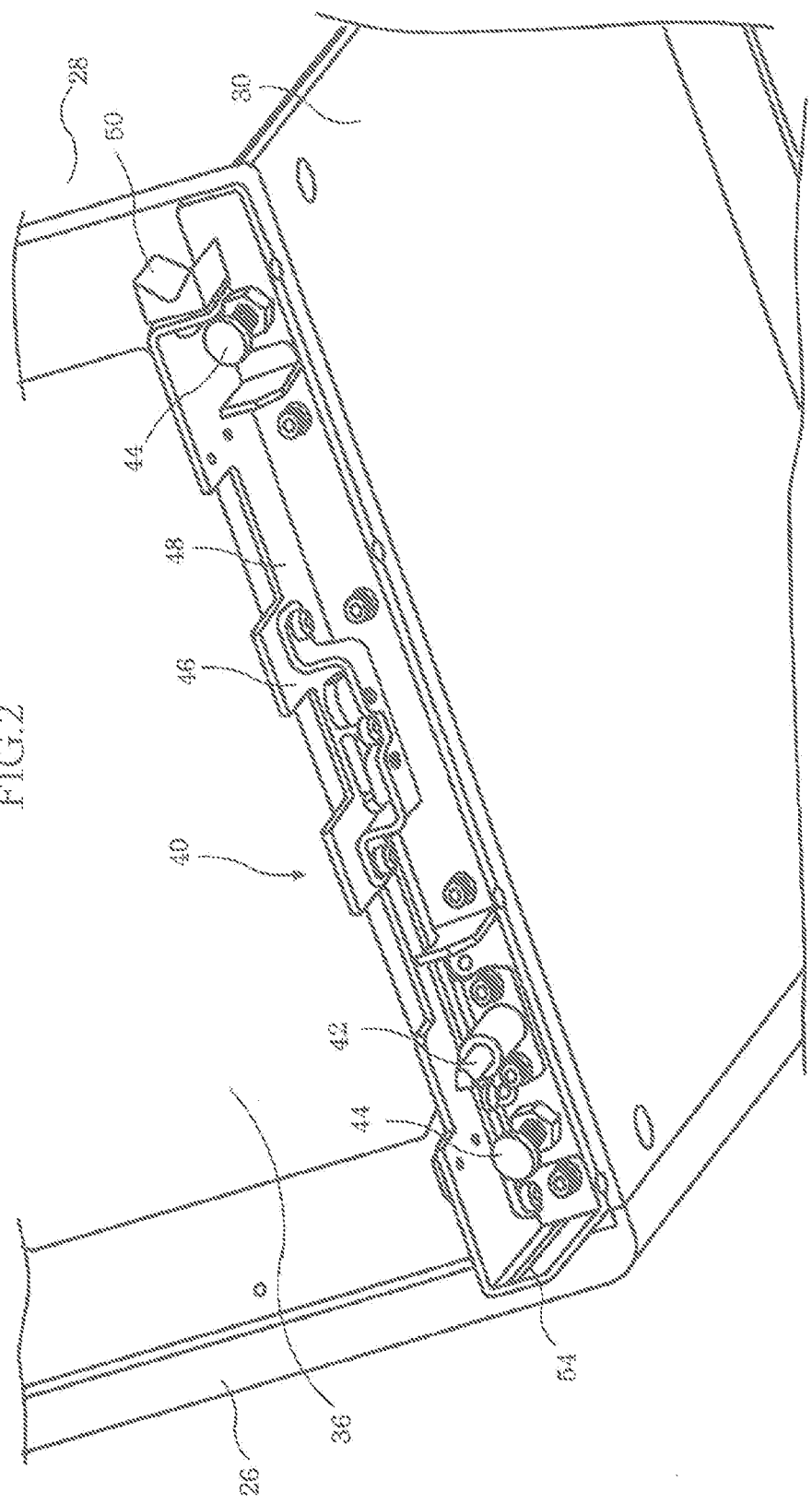
FIG. 2 is a perspective view showing one of legs as viewed from the side of a bottom plate of the minimal manufacturing device, according to first embodiment.

FIG. 2 is a perspective view showing one of the legs 40 as viewed from the side of the bottom plate 36 of the minimal manufacturing device 12.

FIG. 2 illustrates only the leg 40 located right under the left side wall 30. In this example, the right and left legs 40 are configured to be entirely symmetrical when viewed from the side of the front wall 26, and thus only one of the legs will be described. The leg 40 in FIG. 2 is equipped with a locating pin 42, support columns 44, an anti-tip hook 46, a guard plate 48, a stopper block 50, and a slit plate 54. The locating pin 42 is fixed to the leg 40 with its tip turned vertically downward. When the minimal manufacturing device 12 is lowered onto the fixing structure 16 (shown in FIG. 1) on the floor 18

(shown in FIG. 1), a tip of the locating pin 42 is fitted into a hole or groove provided in a positioning block 56 (shown in FIG. 1) on the fixing structure 16. The pin and block may be installed on the leg 40 and fixing structure 16 by changing sides. The pin and block make up a positioning mechanism adapted to accurately position the minimal manufacturing device 12 at a specified location.

Figure 3:
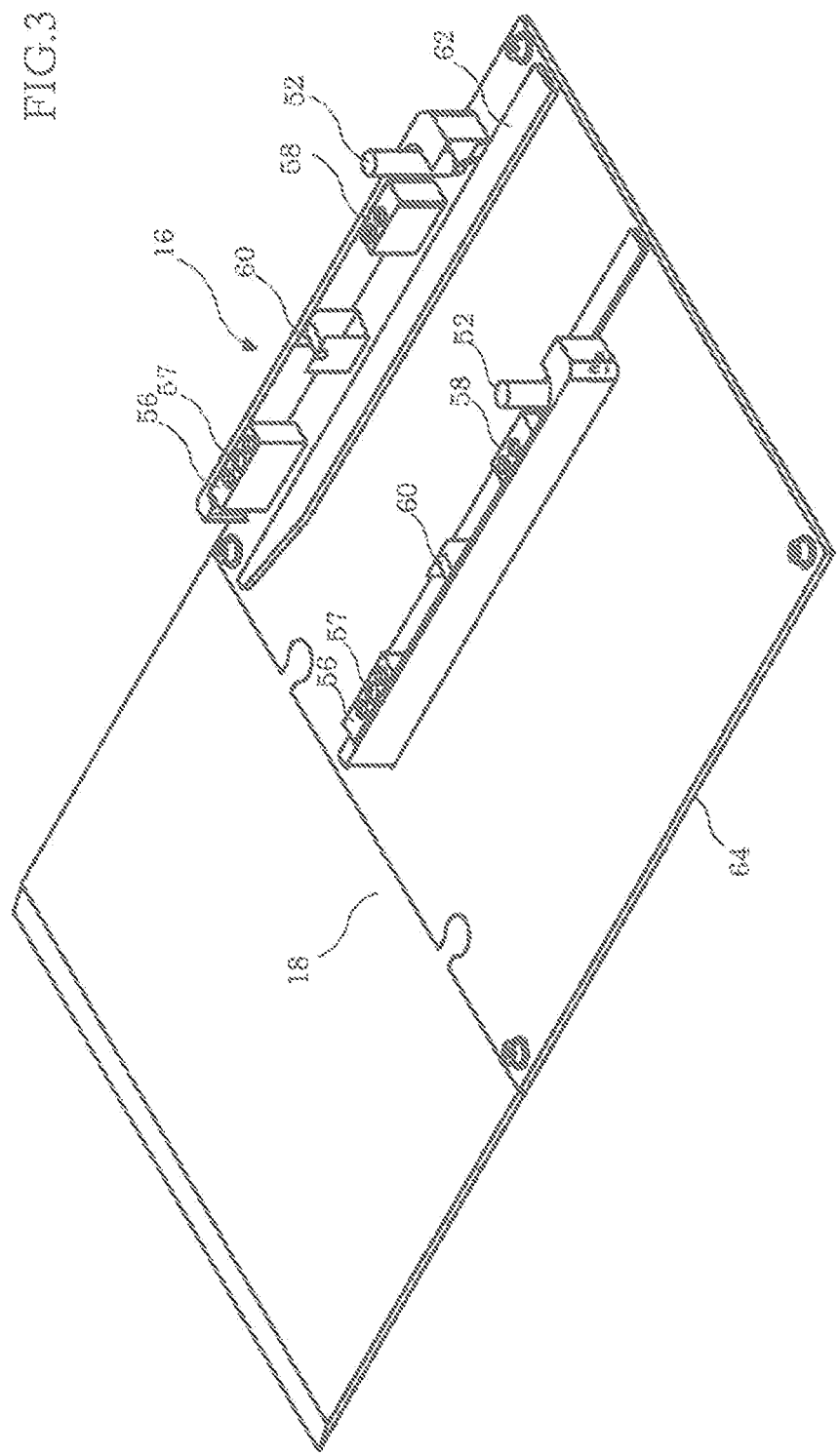
FIG. 3 is a perspective view showing a set of fixing structures installed on a floor, according to first embodiment.

In the example shown in FIGS. 2 and 3, four support columns 44 support a full load of the device, and the locating pin 42 is inserted deep into a pin hole 57 to prevent the minimal manufacturing device 12 from shaking. Also, in the case of a structure in which the locating pin 42 supports the full load of the minimal manufacturing device 12 as described later with reference to FIG. 4, the support columns 44 are supported by a support block 58 or the like to prevent excessive load from being applied to the locating pin 42 when the minimal manufacturing device 12 shakes. The anti-tip hook 46 is a hook mechanism adapted to couple the leg 40 and fixing structure 16 (shown in FIG. 1) to each other. The anti-tip hook 46 has a function to prevent the minimal manufacturing device 12 from falling, for example, when the minimal manufacturing device 12 is hit by an operator or the like or shook by an earthquake or the like.

With the minimal manufacturing device 12 positioned on the fixing structure 16 by the positioning mechanism, the hook mechanism is coupled to a mechanism provided on the fixing structure. The hook mechanism has a function to automatically couple and decouple the hook, in conjunction with the transport machine 14 (shown in FIG. 1). Details will be described later.

When the arm 22 of the transport machine 14 is inserted into the space sandwiched between the pair of legs 40 right under the bottom plate 36 as shown in FIG. 1, the guard plate 48 functions to mechanically protect the legs 40 and guide the arm 22 to a center of the space. Also, when the minimal manufacturing device 12 is placed temporarily on a floor without the fixing structure 16 provided thereon, lower ends of the guard plates 48 serve as support legs by landing on the floor.

When the transport machine 14 loaded with moves over the fixing structure 16 by carrying the minimal manufacturing device 12, the stopper block 50 functions to stop the transport machine 14 above a specified location by colliding with a stopper pin 52 installed on the fixing structure 16 on the floor 18. The stopper block 50 may be installed on the fixing structure 16 while installing the stopper pin 52 on the leg 40. The stopper block 50 and stopper pin 52 make up the stopper mechanism. The stopper mechanism can be constructed by a block of any shape which will stop the minimal manufacturing device 12 above a specified location without getting in the way of lowering the device vertically downward. In the example shown in FIG. 2, the stopper mechanism has a function to guide the minimal manufacturing device 12 vertically downward without shakiness.

(Fixing Structure)

FIG. 3 is a perspective view showing a set of fixing structures 16 installed on the floor 18.

A floor panel 64 in the example of FIG. 3 is a standardized panel measuring, for example, 60 centimeter in length and breadth, and a factory floor is covered with the floor panels 64. Note that in this example, guide rails 62, in which edges sloped to facilitate the movement of the transport machine are formed on the front-wall side of the minimal manufacturing device 12, is installed. Also, in this example, the floor panel 64 is designed to allow two minimal manufacturing devices 12 to be fixed thereto side by side. The fixing structures 16 are placed bilaterally symmetrically at those locations of the floor panel 64 in FIG. 3 which correspond to the pair of legs 40 (shown in FIG. 1) of the minimal manufacturing device 12. Two pairs of the fixing structures 16 are fixed to the floor panel 64. Only one pair is shown in FIG. 3. The positioning blocks 56 and support blocks 58 are placed at locations corresponding to a total of four support columns 44 (shown in FIG. 2) of the legs 40 of the minimal manufacturing device 12.

The support columns 44 are supported on top faces of the positioning blocks 56 and support blocks 58 to allow the minimal manufacturing device 12 to stand upright in a stable manner. The pin hole 57 is provided in the positioning block 56. The minimal manufacturing device 12 is transported onto the fixing structures 16 and caused to stop moving just above a specified location by the stopper mechanisms each made up of the stopper block 50 and stopper pin 52. Subsequently, the minimal manufacturing device 12 is put down, and the locating pins 42 on the legs 40 are inserted into the pin holes 57, positioning the minimal manufacturing device 12 with precision.

Figure 4:
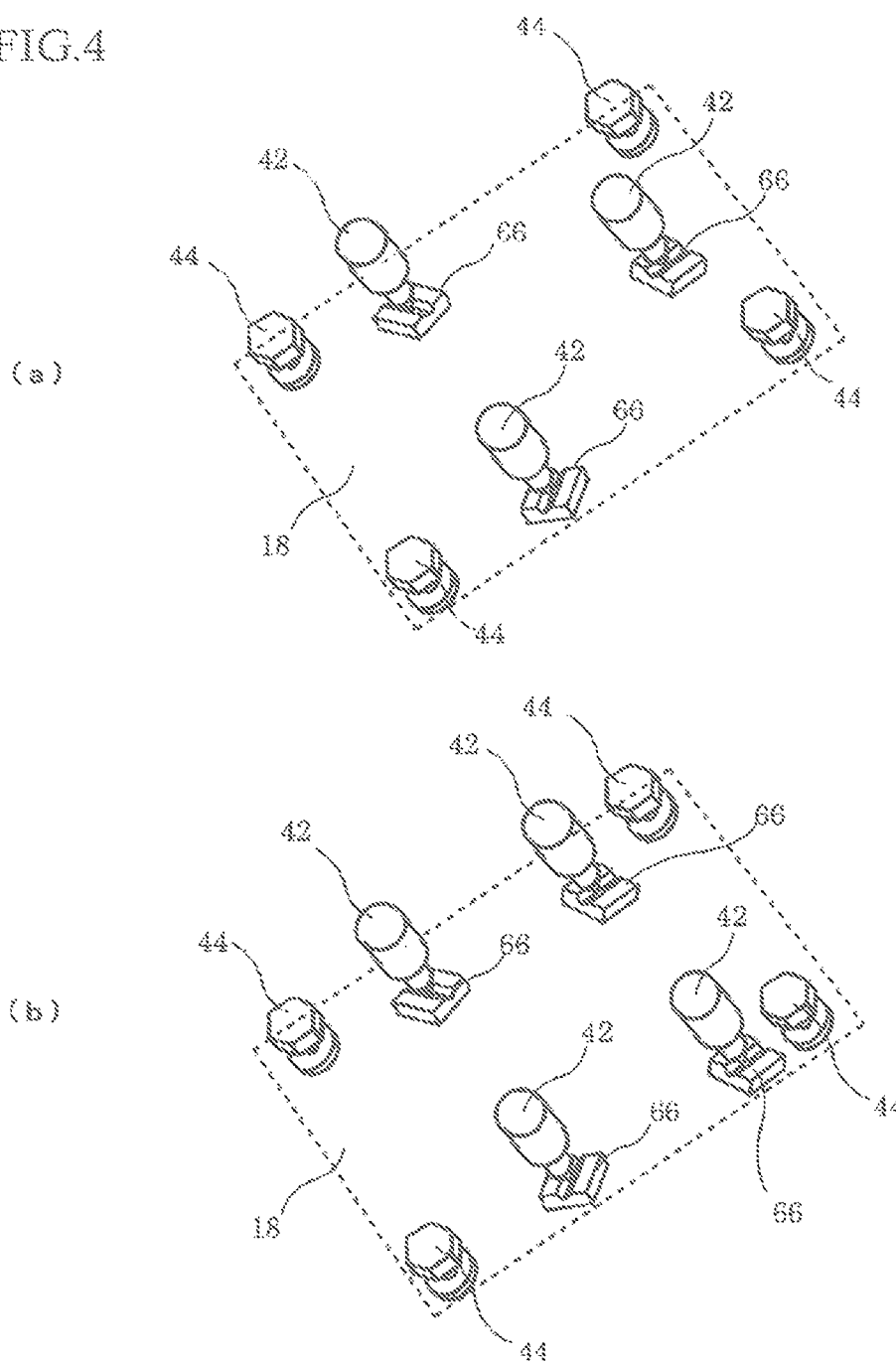
FIG. 4 shows two perspective views (*a*) and (*b*), respectively show variations of a positioning mechanism, according to first embodiment.

In FIGS. 4, (a) and 4(b) are respectively perspective views showing variations of the positioning mechanism.

A high-accuracy positioning mechanism will be described with reference to FIG. 4. It is assumed that the four support columns 44 shown in FIG. 4(a) are identical to those of the legs 40 shown in FIG. 2 and placed at the same locations as in FIG. 2. In the example shown here, three locating pins 42 are placed at locations corresponding to the vertices of an equilateral triangle. When a locating pin 42 is installed at a center on the side of the rear wall 28 of the minimal manufacturing device 12, it is necessary to provide a notch (not shown) in the arm 22 of the transport machine 14 (FIG. 1) so as to avoid collision with the locating pin 42.

The three locating pins 42 are placed at locations corresponding to the vertices of the equilateral triangle and V-grooved seats 66 whose V-grooves are oriented in a center-of-gravity direction of the equilateral triangle are installed on the floor 18. The V-grooved seats 66 function similar to the positioning blocks 56 (shown in FIG. 3). It is sufficient if the V-grooved seats 66 are incorporated into locations where the tips of the locating pins 42 which are inserted into the positioning blocks 56 in the case of FIGS. 2 and 3. When the three illustrated locating pins 42 are slowly lowered onto the V-grooved seats 66 simultaneously, the position, orientation, and attitude of the minimal manufacturing device 12 can be established accurately at the same time.

Also, for example, if four locating pins 42 are used as shown in FIG. 4(b), the minimal manufacturing device 12 can be positioned in a more stable attitude. In this case, the V-grooved seats 66, instead of the positioning blocks 56, can be placed at four locations corresponding to four support columns 44 in total. In FIG. 4(b), all the V-grooved seats 66, instead of the positioning blocks 56, combine the support blocks 58. The support columns 44 are steady rests and are set to a vertical length which will not hamper the locating function of the locating pins 42. The support columns 44 function to share loads applied to the locating pins 42.

(Transport Machine)

Figure 5:
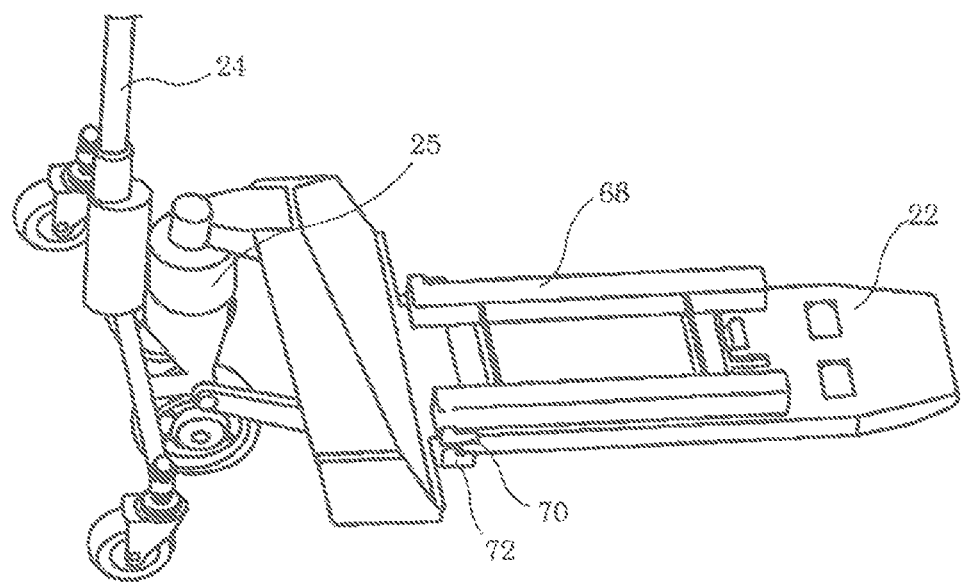
FIG. 5 is a perspective view showing various parts of a transport machine, according to first embodiment.
Figure 6:
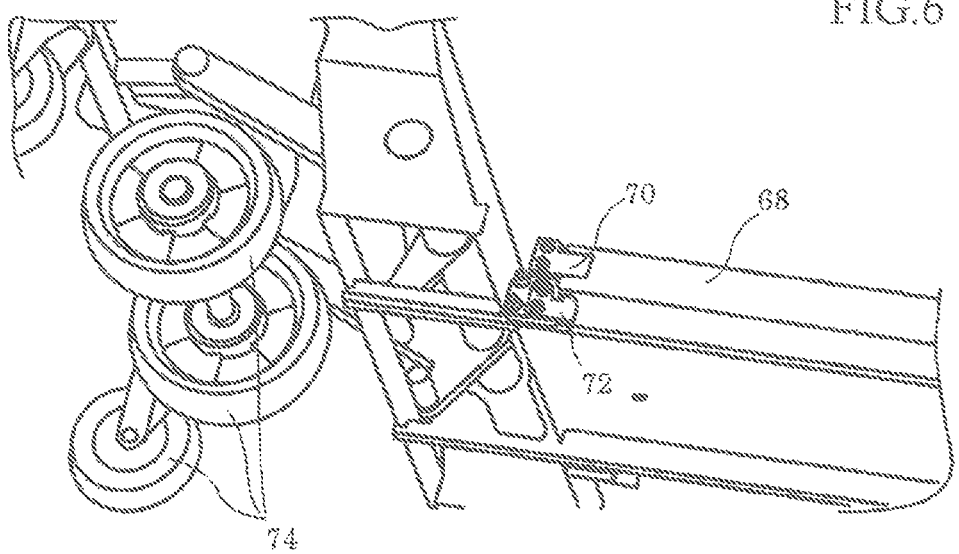
FIG. 6 is a perspective view showing various parts of the transport machine, according to first embodiment.
Figure 7:
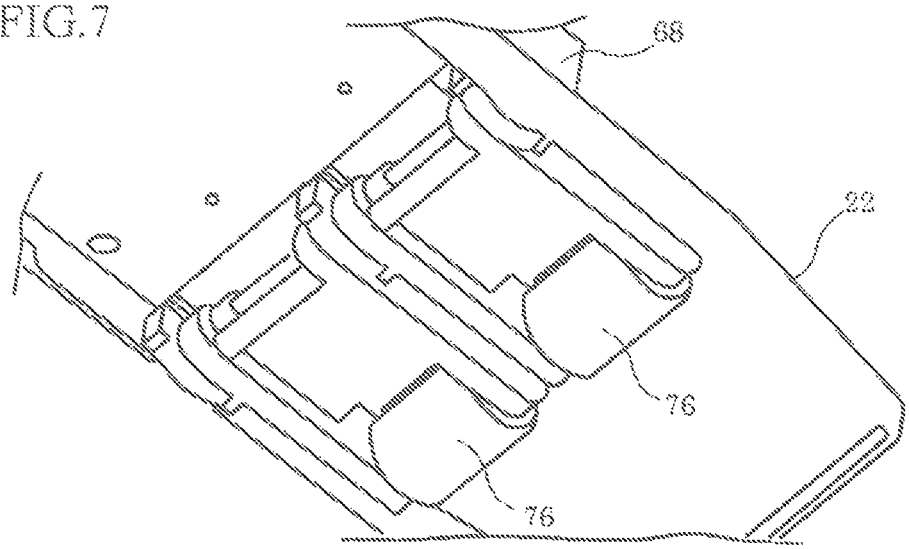
FIG. 7 is a perspective view showing various parts of the transport machine, according to first embodiment.

FIGS. 5 to 7 are perspective views showing various parts of the transport machine 14.

The transport machine 14 is equipped with a lifting mechanism 25 adapted to raise and lower the arm 22 by hydraulic pressure when a handle 24 is operated. This is a known mechanism, and thus description thereof will be omitted. A frame 68 is fixed to a top face of the arm 22, where the frame 68 is placed in contact with the bottom plate 36 of the minimal manufacturing device 12 and adapted to support the minimal manufacturing device 12 from below during transport. Also, support arms 70 are fixed to both right and left flanks of the frame 68 and hook operating arms 72 are fixed to both right and left flanks of the arm 22. Exactly the same support arms 70 and hook operating arms 72 are fixed to opposite flanks in FIGS. 5 and 6.

The support arms 70 and hook operating arms 72 are engaged with part of the pair of legs 40 of the minimal manufacturing device 12 by the action of inserting the arm 22 in the space between the legs 40 of the minimal manufacturing device 12. The support arms 70 prevent the minimal manufacturing device from shaking and falling during the transport of the minimal manufacturing device 12. The hook operating arms 72 function to decouple the hook and couple the hook by operating the hook mechanism installed on the pair of legs 40 of the minimal manufacturing device 12. Details will be described in FIG. 9 and later.

Figure 8:
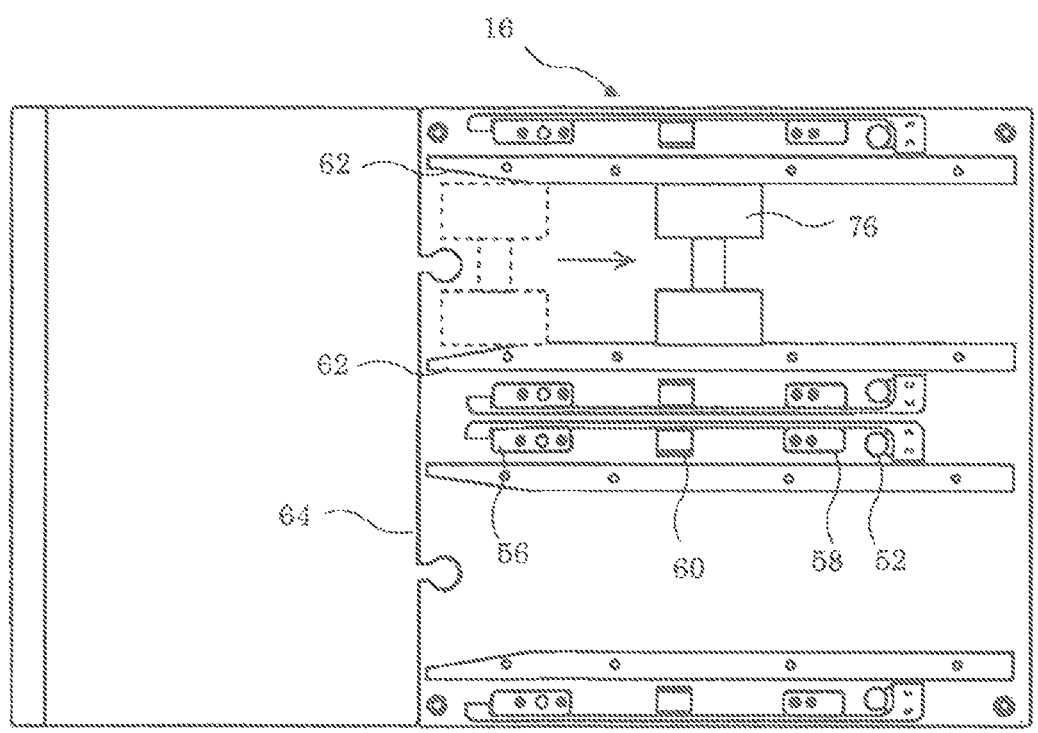
FIG. 8 is a plan view showing two sets of the fixing structures mounted on a floor panel, according to first embodiment.

FIG. 8 is a plan view showing two sets of the fixing structures 16 mounted on the floor panel 64.

The positioning blocks 56, hook pins 60, support blocks 58, and stopper pins 52 are placed side by side, sandwiching both sides of a pair of guide rails 62 placed in parallel. As shown in FIGS. 6 and 7, rear wheels 74 of a three-wheel construction are installed right under the handle 24 of the transport machine 14 and a pair of right and left front wheels 76 are installed right under the arm 22. The guide rails 62 are placed at spacing which approximately coincides with total width of the front wheels 76.

Thus, when the front wheels 76 move from the position of the broken lines to the position of solid lines as indicated by an arrow in FIG. 8, orientation of the arm 22 of the transport machine 14 is parallel to the guide rails 62. Consequently, the minimal manufacturing device 12 carried by the arm 22 is transported accurately to just above the positioning blocks 56 and support blocks 58 without colliding with the adjacent minimal manufacturing devices 12.

In FIG. 8, when the front wheels 76 further advance in the direction of the arrow, the pair of stopper blocks 50 installed on the legs 40 of the minimal manufacturing device 12 collide with the pair of stopper pins 52 of the fixing structure 16. When the pair of right and left stopper pins 52 fit in the V-grooves of the stopper blocks 50, the minimal manufacturing device 12 almost exactly reaches a location just above the positioning blocks 56 and support blocks 58, being oriented properly. Subsequently, the arm 22 is put down, inserting the locating pins 42 into the pin holes 57 of the positioning block 56 while maintaining the positional relationship between the stopper pins 52 and stopper blocks 50. In this way, the minimal manufacturing device 12 can be put down to a specified location accurately.

Figure 9:
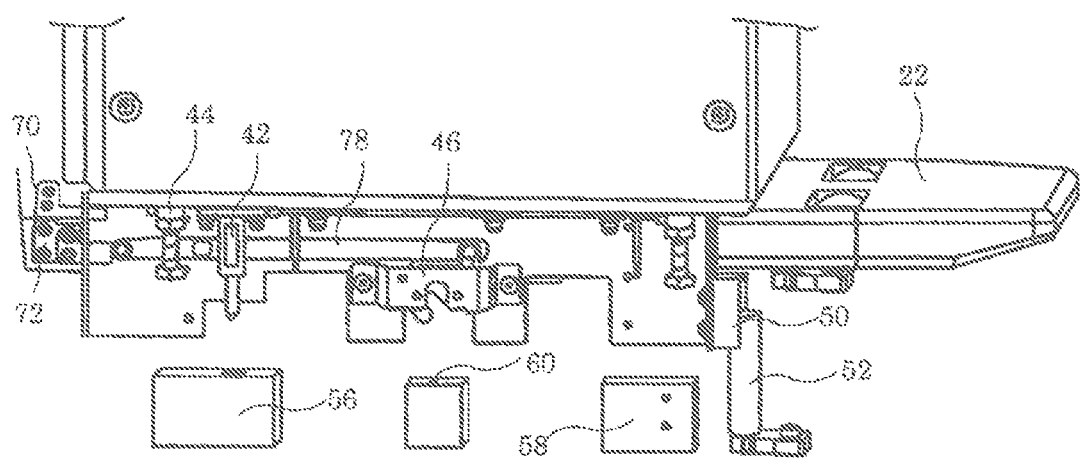
FIG. 9 is a perspective view of principal part in a state existing just before the minimal manufacturing device is put down, according to first embodiment.

FIG. 9 is a perspective view of principal part in a state existing just before the minimal manufacturing device 12 is put down. Also, FIG. 10 is a perspective view showing principal part of the minimal manufacturing device 12, transport machine 14, and fixing structure 16 after the minimal manufacturing device 12 is put down.

Figure 10:
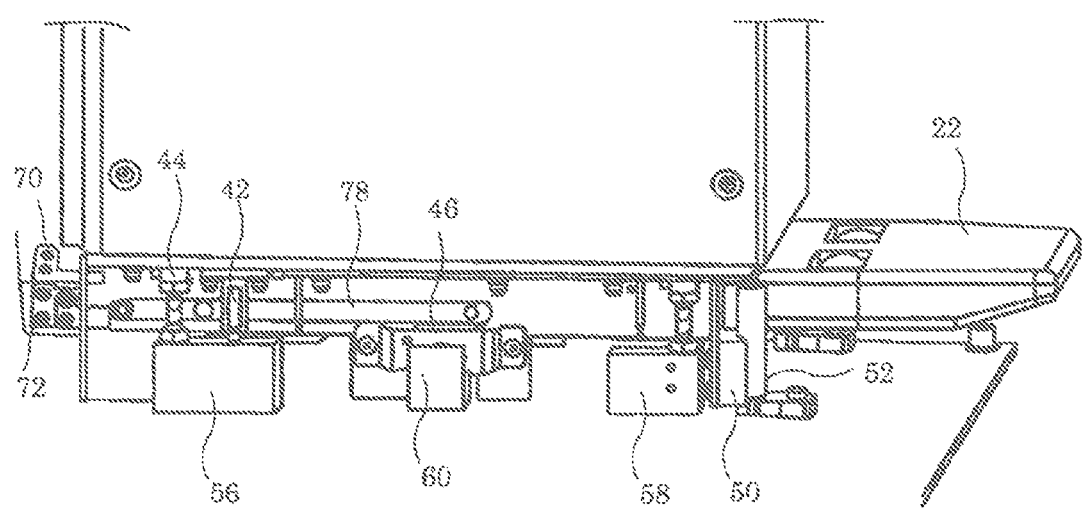
FIG. 10 is a perspective view showing principal part of the minimal manufacturing device, transport machine, and fixing structure after the minimal manufacturing device is put down, according to first embodiment.

As can be seen by comparing FIGS. 9 and 10, just before and after the minimal manufacturing device 12 is put down, the stopper pins 52 remain in contact with the V-grooves of the stopper blocks 50 and so horizontal position of the minimal manufacturing device 12 does not change. Therefore, the locating pins 42 are inserted accurately into the pin holes 57. Even when a positioning mechanism as shown in FIG. 4 is adopted, preferably such a stopper mechanism is installed. Next, the hook mechanism will be described with reference to FIGS. 9 to 11.

Figure 11:
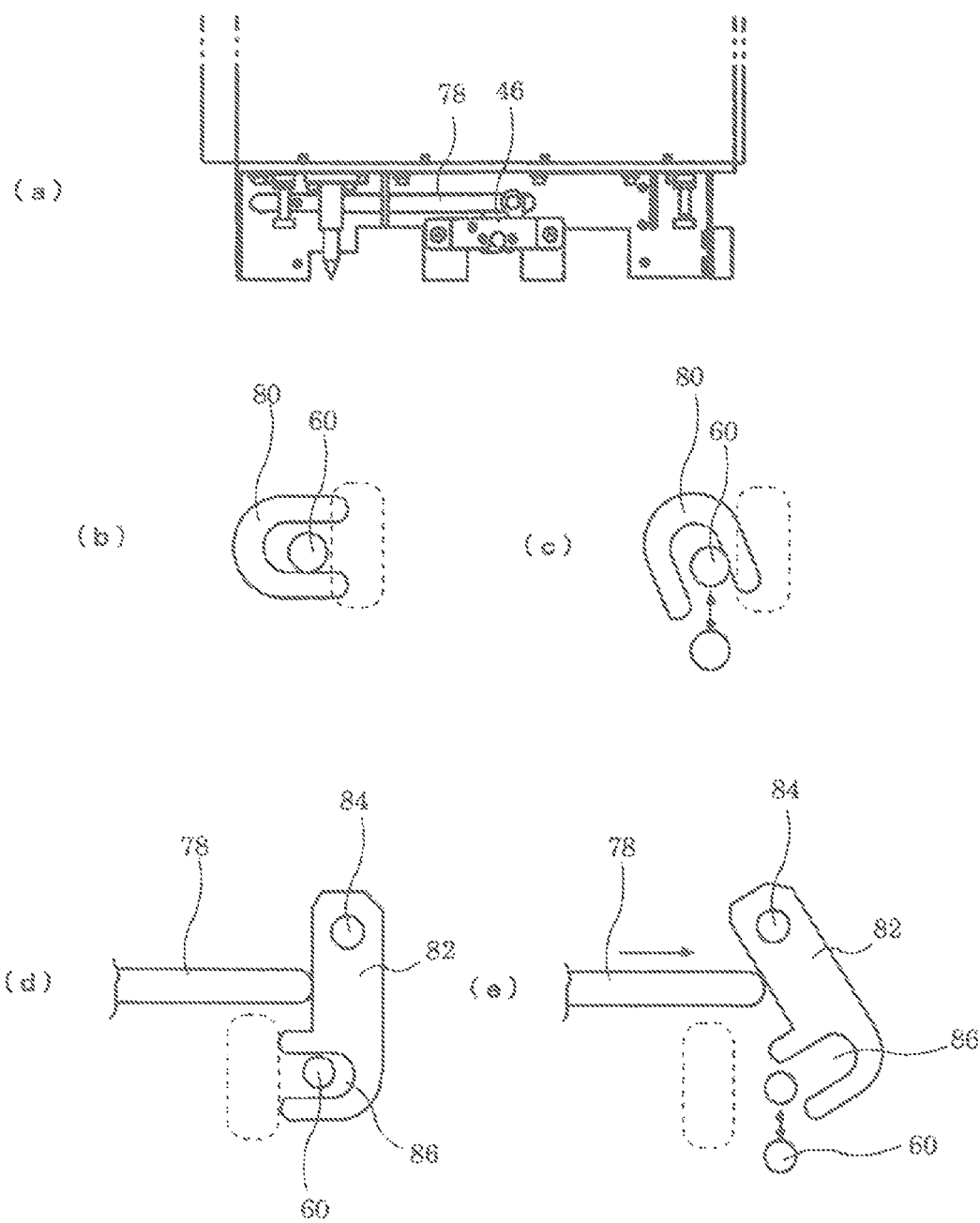
FIG. 11(a)-11(e) are side views of principal part illustrating configurations and operations of an anti-tip hook shown in FIG. 2 and hook pin shown in FIG. 3.

In FIG. 11, (*a*) to 11(*e*) are respectively side views of principal part illustrating configurations and operations of the anti-tip hook 46 (shown in FIG. 2) and hook pin 60 (FIG. 3).

As shown in FIG. 9, the arm 22 of the transport machine 14 is inserted between the pair of legs 40 of the minimal manufacturing device 12, thereby starting to transport the minimal manufacturing device 12. In so doing, the support arms 70 and hook operating arms 72 shown in FIG. 6 are inserted into the slit plates 54 of the legs 40 shown in FIG. 2. When the pair of support arms 70 installed on the left and right of the arm 22 in FIG. 6 are fitted into the slit plates 54 installed on the right and left legs 40 of the minimal manufacturing device 12, the following actions ensure safe transport and allow the anti-tip hook 46 to be operated automatically.

That is, when the minimal manufacturing device 12 placed on the arm 22 is transported, the pair of support arms 70 fitted in the pair of slit plates 54 can prevent the minimal manufacturing device 12 from shaking and tipping on the arm 22. Also, if the arm 22 is inserted until the support arms 70 fit into the slit plates 54, the minimal manufacturing device 12 can be placed on the arm 22 in a correct orientation. Incidentally, it is sufficient if fitting members adapted to fit together are installed on the arm 22 and legs 40 such that the leg support mechanism will fit together with part of the pair of legs 40 of the minimal manufacturing device by the action of inserting the arm 22 into the space described above and separated by the action of pulling the arm 22 out of the space.

After the minimal manufacturing device 12 is placed at the specified location, it is necessary to prevent a fall due to, for example, a hit by an operator, earthquake, or the like. However, a clearance between adjacent minimal manufacturing devices as well as a clearance between the bottom face of the minimal manufacturing device 12 and the floor are small, making the operation of inserting a hand for locking (and/or unlocking) difficult. Thus, a mechanism is installed which automatically locks the minimal manufacturing device 12 when the minimal manufacturing device is put down at the specified location or when the transport machine is pulled out from under the minimal manufacturing device 12.

A lever 78 and the anti-tip hook 46 which are shown in FIG. 11 are interlocked. As shown in FIG. 9, when the hook operating arm 72 is fitted into the slit plate 54, the lever 78 is pushed in a longitudinal direction by the hook operating arm 72. As a result, a U-shaped pawl 80 of the anti-tip hook 46 rotates, changing from a state of FIG. 11(*b*) to a state of FIG. 11(*c*). In this state, when the minimal manufacturing device 12 is put down, the hook pin 60 on the floor 18 enters a U-groove of the U-shaped pawl 80, rotating and thereby returning the U-shaped pawl 80 to the state of FIG. 11(*b*). Consequently, the U-shaped pawl 80 becomes locked, refusing to return again to the state of FIG. 11(*c*). The hook pin 60 is constrained by the U-shaped pawl 80, preventing the minimal manufacturing device 12 from falling to the floor 18.

Also, when the arm 22 is inserted right under the bottom plate 36 of the minimal manufacturing device 12 to move the minimal manufacturing device 12, the hook operating arms 72 are fitted into the slit plates 54, pushing the levers 78 in the longitudinal direction. Consequently, the U-shaped pawl 80 of each anti-tip hook 46 changes from the state of FIG. 11(*b*) to the state of FIG. 11(*c*), releasing the hook pin 60. This makes it possible to lift the minimal manufacturing device 12 directly upward. The mechanism of the anti-tip hook 46 and related parts can be implemented by a well-known apparatus.

Note that the above function can be implemented by a still simpler mechanism. As shown in FIG. 11(*d*), a hook arm 82 having a U-shaped groove 86 on a lower flank is hung inside the anti-tip hook 46 so as to swing using a support shaft 84 as a fulcrum. This is followed by installation of such a mechanism that the hook operating arm 72 will push the hook arm 82 via the lever 78 when the hook operating arm 72 is fitted into the slit plate 54. Consequently, as shown in FIG. 11(*e*), the hook pin 60 becomes ready to move up and down freely. That is, the minimal manufacturing device 12 can be raised and lowered freely on the fixing structure 16.

Subsequently, when the arm 22 is pulled out from between the legs 40 of the minimal manufacturing device 12, the hook operating arms 72 are withdrawn from the slit plates 54. If the lever 78 is configured to be pushed back by rotating the hook arm 82 from the state of FIG. 11(*e*) to the state of FIG. 11(*d*) by the elasticity of a spring (not shown), the hook pin 60 is constrained by the U-shaped groove 86 of the hook arm 82. This prevents the minimal manufacturing device 12 from falling.

Subsequently, if the line is rearranged, the arm 22 is inserted right under the bottom plate 36 of the minimal manufacturing device 12 to move the minimal manufacturing device 12. Consequently, the hook operating arms 72 are fitted into the slit plates 54, pushing the levers 78 in the longitudinal direction. As a result, the hook arms 82 enter the state of FIG. 11(*e*) again, releasing the hook pins 60. The hook mechanism described above makes it possible to automate the operation of supporting and fixing the minimal manufacturing device 12 securely both during transport and after installation. Also, although in the above description, the transport machine is driven by human labor, the transport machine may be designed to be driven automatically.

In the above embodiment, both the hook operating arms 72 and support arms 70 are installed on the transport machine 14. The support arms 70 are fitted into the slit plates 54 installed on the right and left legs 40 of the minimal manufacturing device 12 thereby preventing the minimal manufacturing device 12 from falling during transport. The hook operating arms 72 operate the anti-tip hooks 46 of the fixing structures. However, in the embodiment, both the hook operating arms 72 and support arms 70 are fitted into the slit plates 54 installed on the right and left legs 40 of the minimal manufacturing device 12. In this case, the hook operating arms 72 also have a function to prevent the minimal manufacturing device 12 from falling during transport. Therefore, in this embodiment, the support arms 70 may be omitted. On the other hand, if the fixing structure is equipped with another mechanism for operating the anti-tip hook 46, only the support arms 70 may be installed by omitting the hook operating arms 72. Also, although in the embodiment described above, a hook-shaped coupling mechanism has been illustrated as a hook, a pin-type, screw-type, knuckle-type, or buckle-type coupling mechanism may be adopted as well.

As described above, according to the present embodiment, the minimal manufacturing device is transported by the transport machine and put down on the fixing structure on the floor. The stopper mechanism stops the minimal manufacturing device accurately in a correct orientation and the positioning mechanism does high-accuracy positioning by fitting the pin and block together. Subsequently, the hook mechanism couples the legs to the fixing structure, thereby fixing the minimal manufacturing device stably to the floor.

According to the present embodiment, when lowered onto the fixing structure, the minimal manufacturing device can be automatically positioned with high accuracy if the locating pin with its tip turned vertically downward is fitted into the positioning block.

According to the present embodiment, since the anti-tip hook is coupled to the floor when the arm of the transport machine is pulled out from between the legs of the minimal manufacturing device and the anti-tip hook is released when the arm is inserted, the operation for fall prevention can be automated.

According to the present embodiment, when the arm of the transport machine is inserted between the legs of the minimal manufacturing device, the leg support mechanism automatically fits in to prevent the minimal manufacturing device from falling during transport.

According to the present embodiment, since the deck for use to receive and send out workpieces is installed on the front wall, if adjacent devices can be placed close to each other, an inter-process automated transfer mechanism for materials and products can be downsized.

Second Embodiment

A second embodiment of the present invention will be described in detail below.

(Schematic Configuration)

In FIG. 12, (*a*) is a perspective view schematically showing a production line on which minimal manufacturing devices 112 according to the present embodiment are laid out and (*b*) is a perspective view of a transport machine.

According to the present embodiment, as shown in FIG. 12, the minimal manufacturing devices 112 are transported by a special-purpose transport machine and laid out on a floor 118 equipped with a predetermined fixing structure 116. By combining the minimal manufacturing devices 112 for a necessary number of processes, the production line is implemented. For example, an automated transfer mechanism such as a robot arm (not shown) is used to convey materials and products among the minimal manufacturing devices 112.

As shown in FIG. 12(*a*), the minimal manufacturing device 112 is shaped to be tall in relation to its base area. Thus, the minimal manufacturing device 112 is unstable, as it is, with respect to vibrations/shocks. Moreover, for example, accurate positioning is required for automatic conveyance of materials among minimal manufacturing devices 112. Thus, a transport machine 114 in FIG. 12 has a function to lower the minimal manufacturing device 112 accurately onto the fixing structure 116. Also, the fixing structure 116 has a function to fix the minimal manufacturing device 112 accurately and reliably to the floor 118. To make layout changes of a large number of minimal manufacturing devices 112 in a short time, both the transport machine 114 and fixing structure 116 have constructions with good operability.

Adjacent minimal manufacturing devices 112 are arranged at minimum spacing. For example, in a space with a width of approximately 30 centimeter, one minimal manufacturing device 112 is placed at a spacing of about 5 millimeter to 1 centimeter from adjacent devices. By providing the spacing, each minimal manufacturing device 112 can be replaced freely without affecting the other devices. Also, if the devices are placed densely at narrow spacing, factory space can be utilized effectively. Furthermore, parts and products can be transported easily from process to process allowing a conveyor to be downsized.

The production line using the minimal manufacturing devices 112 is characterized by being able to be rearranged freely and easily. To rearrange the production line, the transport machine 114 lifts each minimal manufacturing device 112 from the floor 118, transports the device 112 to a desired location, and then accurately positions and fixes the device 112 to the floor 118. The transport machine according to the present embodiment is equipped with a function to carry out this operation easily and simply. Also, the present embodiment is equipped with a high-accuracy mechanism adapted to prevent collisions with the adjacent minimal manufacturing devices 112 during positioning on the floor 118 and installation/removal operation.

Figure 13:
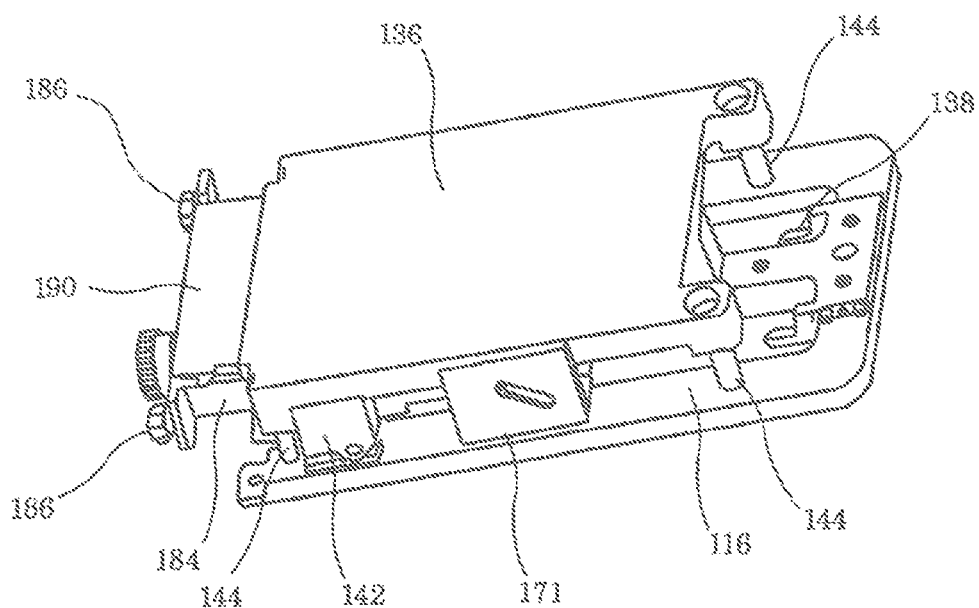
FIG. 13 is a perspective view showing how a bottom plate is placed on a fixing structure, according to second embodiment.
Figure 14:
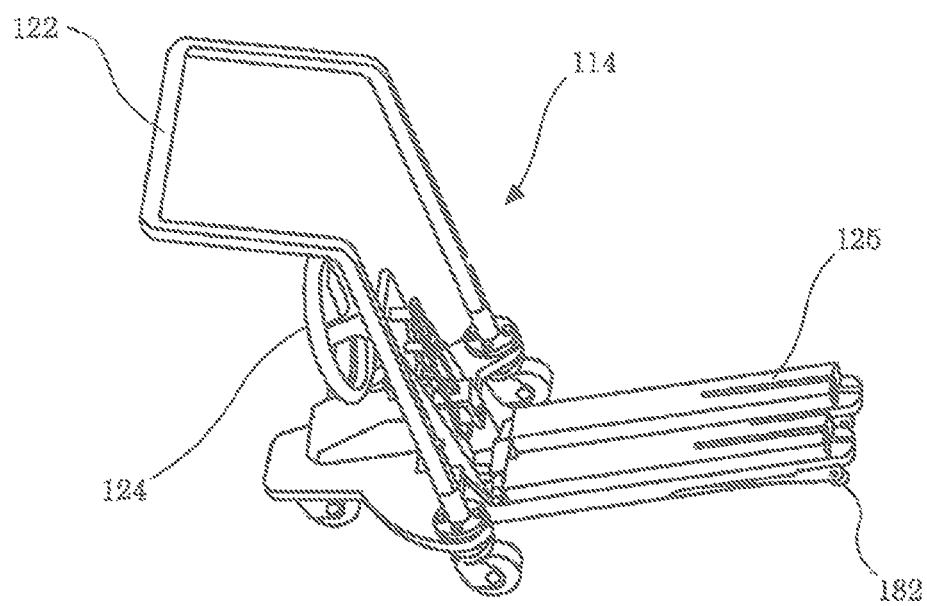
FIG. 14 is a perspective view of a machine adapted to transport a minimal manufacturing device shown in FIG. 13.

FIG. 13 is a perspective view showing how a bottom plate 136 is placed on the fixing structure 116. FIG. 14 is a perspective view of a machine adapted to transport the minimal manufacturing device 112 (shown in FIG. 13) by being inserted under the bottom plate 136 according to the present embodiment.

The fixing structure 116 is fixed to a predetermined location on the floor where the minimal manufacturing device 112 (shown in FIG. 13) is installed. The bottom plate 136 is fixed to a bottom face of the minimal manufacturing device 112. When the bottom plate 136 is accurately positioned on the fixing structure 116, the minimal manufacturing devices 112 can be lined up with equal spacing of, for example, 5 to 120 millimeter. This has been described in the above embodiment.

The fixing structure 116 is provided with a structure adapted to receive locating legs 142 and support columns 144 installed on the bottom plate 136. Details will be described in FIG. 15 and later.

The fixing structure 116 is provided with coupling mechanisms 171 adapted to fix the bottom plate 136 to the fixing structure 116. Mechanisms such as levers 184 and knobs 186 used to operate the coupling mechanisms 171 are attached to the bottom plate 136. Note that components with the same function are denoted by the same reference numeral herein even if the components differ in mounting locations.

A lifter gate 190 is provided on the left side of the bottom plate 136 in FIG. 13, and when the lifter gate 190 is open, the transport machine 114 (shown in FIG. 14) can be inserted under the bottom plate 136.

With front wheels 182 of the transport machine 114 running on a front wheel stopper 138 of the fixing structure 116, the bottom plate 136 is positioned at an optimum location above the fixing structure 116. Therefore, if the bottom plate 136 is lowered by operating the transport machine 114, the bottom plate 136 can be accurately put down on a predetermined location on the fixing structure 116.

In FIG. 14, the transport machine 114 is moved by pushing a grip 122. In the state shown in FIG. 13, to insert a lifting mechanism 125 under the bottom plate 136 (shown in FIG. 13), the insertion is started from the side of the lifter gate 190 and stopped when the front wheels 182 run on the front wheel stopper 138. When the handle 124 is turned, the lifting mechanism 125 moves up and down, allowing the bottom plate 136 to be raised and lowered.

Figure 15:
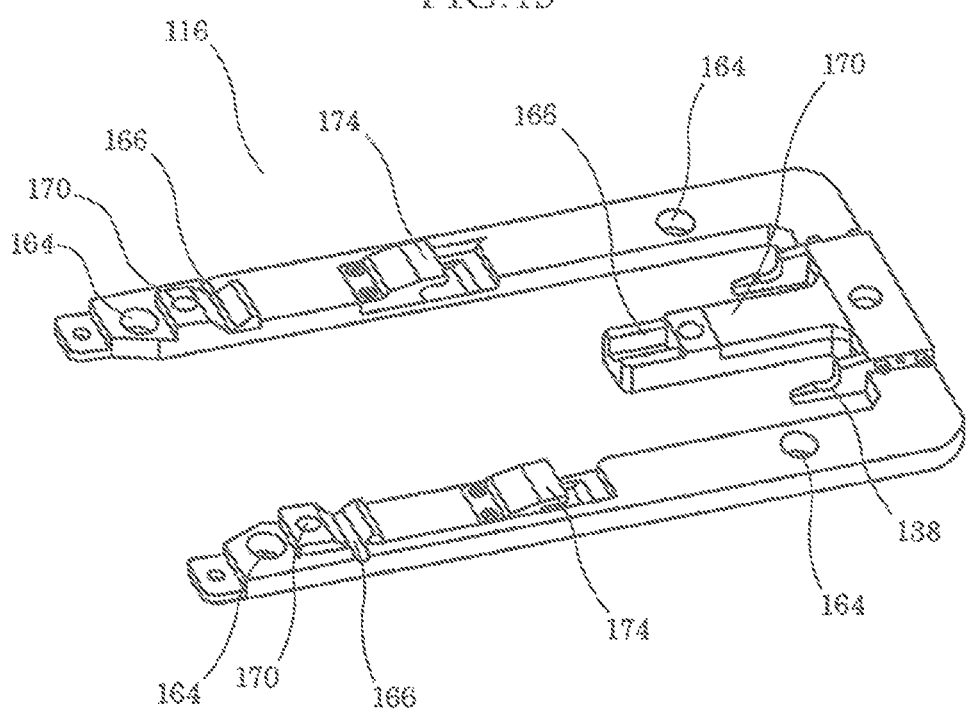
FIG. 15 is a perspective view of the fixing structure, according to second embodiment.
Figure 16:
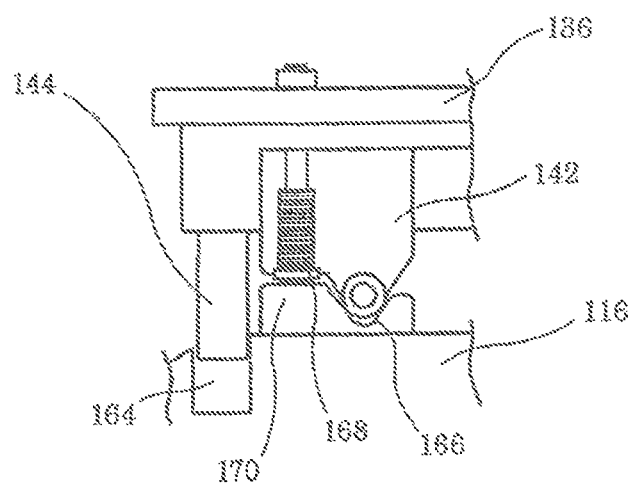
FIG. 16 is a side view of principal part showing how the bottom plate 136 is placed on the fixing structure, according to second embodiment.

FIG. 15 is a perspective view of the fixing structure 116. FIG. 16 is a side view of principal part showing how the bottom plate 136 is placed on the fixing structure 116. FIG. 16 reveals a leveling screw 168 and a portion under the locating leg 142 by removing part of the locating leg 142.

The fixing structure 116 has the shape of a letter E made up of two parallel long arms on both sides and a short arm in a center. V-grooved seats 166 are provided on ends of the long arms and short arm at three locations. The locating legs 142 provided at three locations of the bottom plate 136 are placed on the V-grooved seats 166. As shown in FIG. 16, a V-shaped groove is cut in each V-grooved seat 166 with high accuracy. That surface of the locating leg 142 which is placed in contact with the V-groove is formed into a spherical shape and the locating leg 142 and V-grooved seat 166 contact each other at two points. Also, the V-grooves in the three V-grooved seats 166 differ from each other in horizontal orientation. In the example of FIG. 15, the orientation of one V-groove is orthogonal to the orientation of the other two V-grooves. Thus, when the three locating legs 142 and three V-grooved seats 166 contact each other, the bottom plate 136 is positioned accurately at a predetermined location above the fixing structure 116.

As described earlier, the transport machine 114 moves its front wheels 182 (shown in FIG. 14) forward from the left in FIG. 15 and runs on the front wheel stopper 138 while carrying the minimal manufacturing device 112. In so doing, the minimal manufacturing device 112 can be put on a predetermined location of the transport machine 114 such that the three locating legs 142 of the bottom plate 136 will be right above the three V-grooved seats 166 of the fixing structure 116.

If the minimal manufacturing device 112 with the bottom plate 136 attached thereto is placed in a place other than the fixing structure 116, when the locating legs 142 touch the floor, those portions of the locating legs 142 which contact the V-grooved seats 166 will be damaged or deformed, resulting in reduced positioning accuracy. Thus, the support columns 144 are installed in four corners of the bottom plate 136. The support columns 144 are configured to be long enough to support the bottom plate 136 at a height where the locating legs 142 will not directly touch the floor. An appropriate number of the support columns 144 is three to four.

Column rests 164 configured to receive the support columns 144 are installed at corresponding locations on the fixing structure 116. Also, when the fixing structure 116 is fixed to the floor, if the floor is not exactly level, the bottom plate 136 cannot be supported horizontally, and consequently the minimal manufacturing device 112 will become tilted. Thus, on the bottom plate 136, the leveling screws 168 are installed at locations adjacent to the locating legs 142. An externally threaded portion of the leveling screw 168 has been screwed into the bottom plate 136 and a length by which the leveling screw 168 sticks out of an undersurface of the bottom plate 136 can be adjusted by turning the leveling screw 168.

On the fixing structure 116, leveling mounts 170 are installed next to the V-grooved seats 166. When stuck out by some length, the leveling screw 168 on the bottom plate 136 hits the leveling mounts 170 on the fixing structure 116. When protruding lengths of the three leveling screws 168 are adjusted, one of the locating legs 142 is suspended, allowing the attitude of the minimal manufacturing device 112 to be corrected. In so doing, if an amount by which the locating leg 142 is suspended above the V-grooved seat 166 is set within tolerances, there will be no deviation in positioning. In this way, the attitude can be adjusted by suspending one of the locating legs 142 while maintaining positional accuracy.

Figure 17:
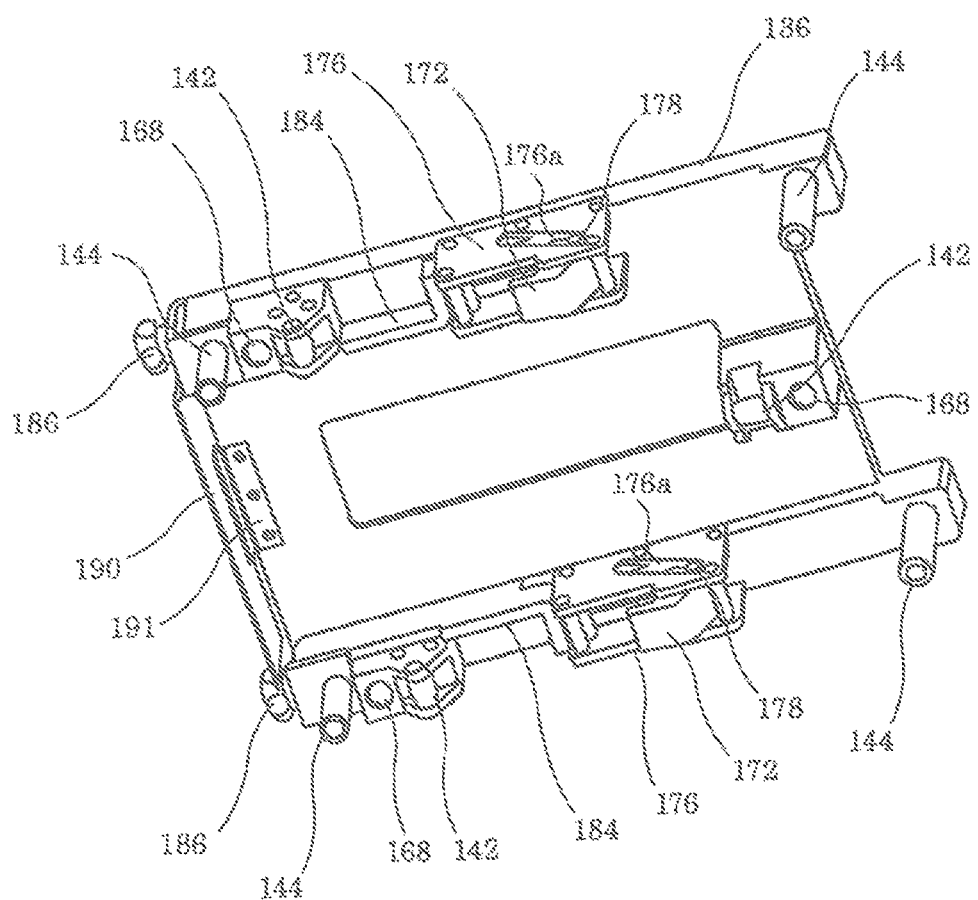
FIG. 17 is a bottom view of the bottom plate, according to second embodiment.

FIG. 17 is a bottom view of the bottom plate 136.

The support columns 144 are fixed to four corners of the undersurface of the bottom plate 136 as described earlier. Also, the lifter gate 190 is openably and closably attached by a hinge 191 on the left side of FIG. 17. Three sets of the locating legs 142 and leveling screws 168 are fixed near both sides of the lifter gate 190 and in right part of the bottom plate 136. Also, the hook arms 172 supported by guide plates 176 and the levers 184 used to operate the hook arms 172 are mounted in centers on flanks of the bottom plate 136.

The knob 186 is attached to a left end portion in FIG. 17 of the lever 184, and when the lever 184 is pulled out leftward in FIG. 17 by pulling the knob 186 leftward in FIG. 17, a cam pin 178 of the hook arm 172 moves along a groove in the guide plate 176, pulling up the hook arm 172. Consequently, the hook arm 172 and a hook catcher 174 (shown in FIG. 15) are unlocked from each other. In so doing, the bottom plate 136 and fixing structure 116 are uncoupled from each other, allowing the bottom plate 136 to move. This state is shown in FIG. 13.

Figure 18:
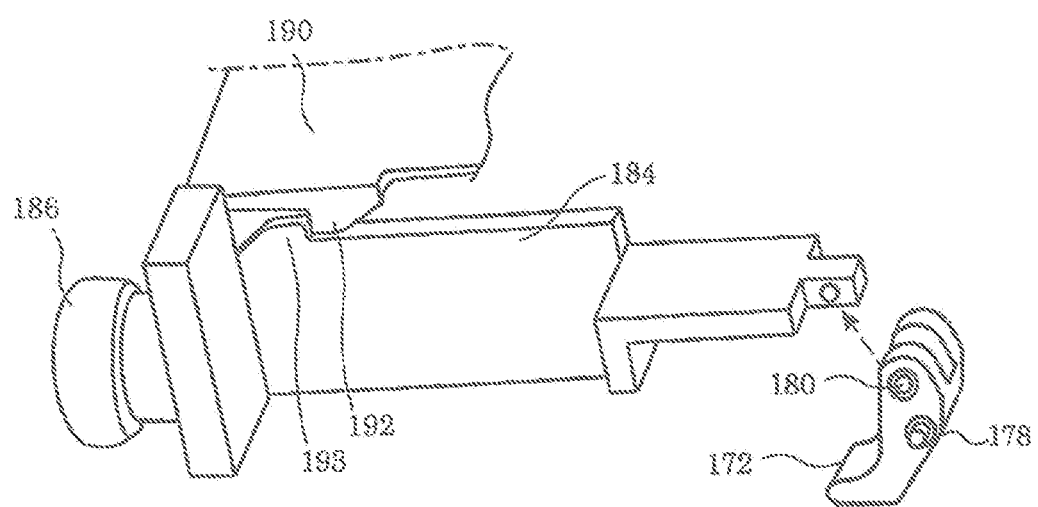
FIG. 18 is a perspective view of a lever and its vicinity, according to second embodiment.
Figure 19:
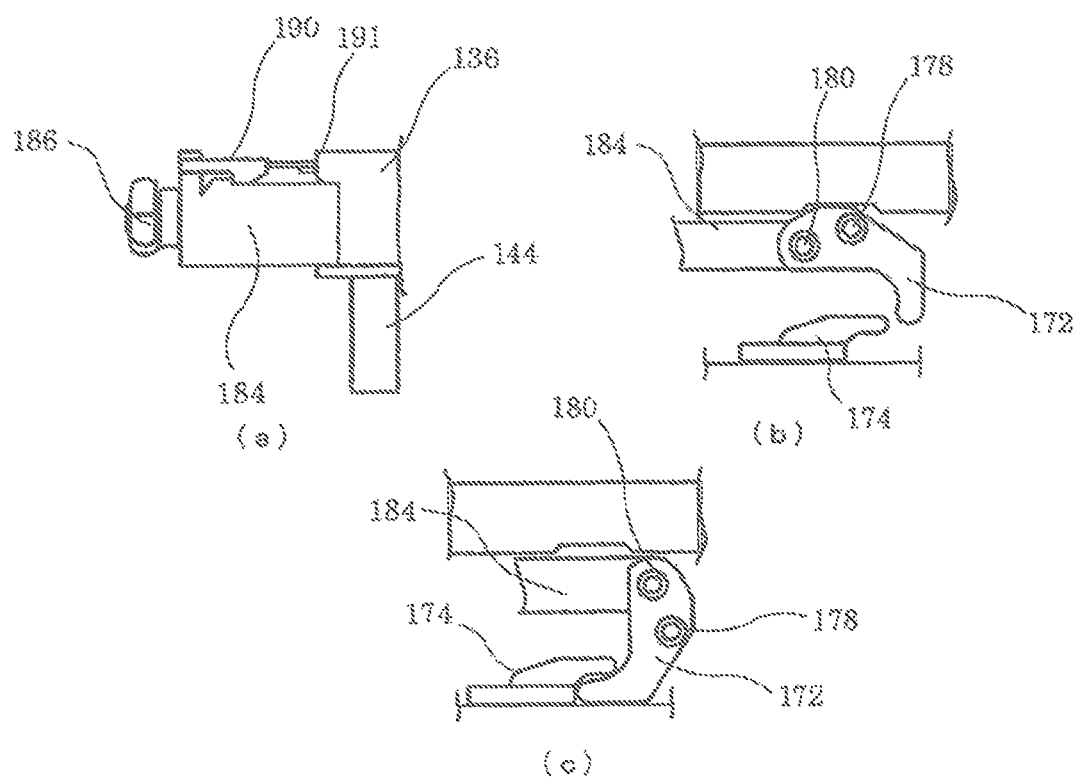
In FIG. 19, (a) is a side view of the lever 184 and its vicinity while (b) and (c) are side views showing a function of a hook arm, according to second embodiment.

FIG. 18 is a perspective view of the lever 184 and parts around it. In FIG. 19, (a) is a side view of the lever 184 and its vicinity while (b) and (c) are side views showing a function of the hook arm 172.

As shown in FIG. 18 and FIG. 19(a), when the levers 184 are pulled out using the knobs 186, pawls 192 on both lateral ends of the lifter gate 190 engage with pawls 193 on upper edges of the levers 184. In this state, the lifter gate 190 maintains the open state and the levers 184 remain pulled out, refusing to return easily. Also, when the levers 184 remain pulled out, since the lock is released as shown in FIG. 19(b), the bottom plate 136 may be lifted by the transport machine 114. Since the lifter gate 190 remains open, the transport machine 114 (shown in FIG. 14) can be inserted under the bottom plate 136.

On the other hand, if the lever 184 is thrust under the bottom plate 136 with the lifter gate 190 lifted slightly, the hook arm 172 shown in FIGS. 17 and 19(b) rotates around a link portion 180 along with movement of the cam pin 178 along a groove 176a in the guide plate 176. Consequently, as shown in FIG. 19(c), the hook arm 172 is engaged on the side of a free end with the hook catcher 174. In this way, the bottom plate 136 and fixing structure 116 are coupled to each other to prevent the minimal manufacturing device 112 from falling. At the same time, since the levers 184 supporting the lifter gate 190 from below are removed, the lifter gate 190 rotates around the hinge 191 under gravity, closing the left side of the bottom plate 136. This disables the lifter from being inserted under the bottom plate 136. This structure prevents the lifter from being operated under locked conditions by mistake.

Figure 20:
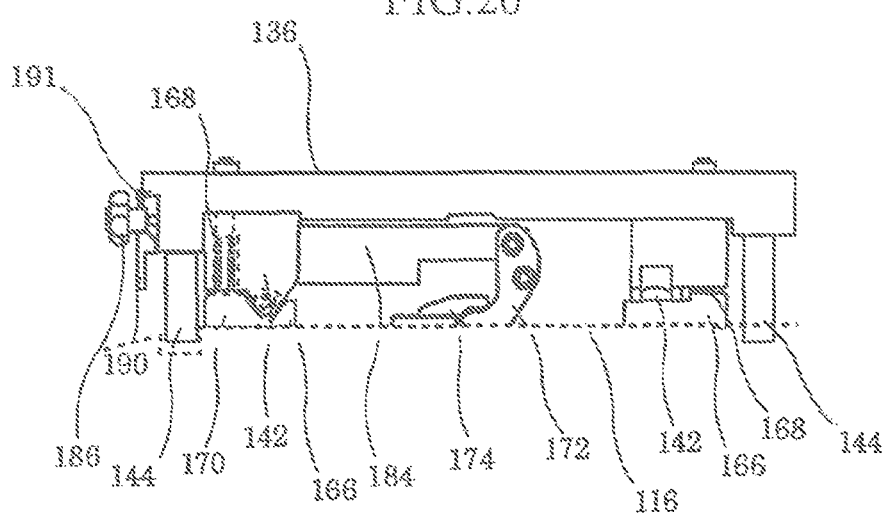
FIG. 20 is a side view of the bottom plate fixed to the fixing structure.

FIG. 20 is a side view of the bottom plate 136 fixed to the fixing structure 116.

The lifter gate 190 on the left side of the bottom plate 136 is closed. If installation can be done successfully based only on the relationship between the locating legs 142 and V-grooved seats 166, positioning can be completed without making any adjustment. If slight tilt adjustment is necessary, an amount of protrusion of one of the leveling screws 168 is adjusted. The above configuration allows the minimal manufacturing devices 112 to be installed easily on the floor and thereby completes a production line using the minimal manufacturing devices 112.

The present invention can not only be adopted for semiconductor manufacturing equipment, but also widely adopted for production lines for high-mix, low-volume production in various fields.

As described above, according to the present embodiment, the minimal manufacturing device is transported by the transport machine and put down on the fixing structure on the floor. The stopper mechanism stops the minimal manufacturing device accurately in a correct orientation and the positioning mechanism does high-accuracy positioning by fitting the pin and block together. Subsequently, the hook mechanism couples the legs to the fixing structure, thereby fixing the minimal manufacturing device stably to the floor.

According to the present embodiment, the minimal manufacturing device can be easily coupled and decoupled with the fixing structure only by thrusting and pulling out the lever 184.

According to the present embodiment, the transport machine cannot be inserted if the minimal manufacturing device is coupled with the fixing structure.

According to the present embodiment, the transport machine 114 can be accurately located between the minimal manufacturing device and the fixing structure.

According to the present embodiment, the attitude of the minimal manufacturing device can be adjusted while maintaining positional accuracy.

What is claimed is:

1. A mounting structure of movable manufacturing device, comprising:
   a fixing structure which is installed on a floor to mount the movable manufacturing device,
   a leg portion which is installed on a bottom plate of the movable manufacturing device to be placed on the fixing structure,
   a positioning mechanism which determines a placing position of the leg portion using a floor side positioning member equipped by the fixing structure and a leg side positioning member equipped by the leg portion, when the leg portion is placed on the placing position,
   a coupling mechanism which prevents the movable manufacturing device from falling, by coupling the leg portion with the fixing structure, using a floor side coupling member equipped by the fixing structure and a leg side coupling member equipped by the leg portion, after the leg portion is placed on the placing position, and
   a stopper mechanism to stop the movable manufacturing device approximately right above the placing position when the movable manufacturing device is carried above the fixing structure approximately horizontally.

2. The mounting structure of movable manufacturing device according to claim 1, wherein;
   the positioning mechanism comprises,
   a locating hole as one of the floor side positioning member and the leg side positioning member, and
   a locating project as the other of the floor side positioning member and the leg side positioning member,
   the placing position of the leg portion is determined by inserting the locating project into the locating hole.

3. The mounting structure of movable manufacturing device according to claim 1, wherein;
   the positioning mechanism comprises,
   plural locating grooves as one of the floor side positioning members and the leg side positioning members, and
   plural locating projects as the other of the floor side positioning members and the leg side positioning members,
   orientations of the plural locating grooves differ from each other, and
   the placing position of the leg portion is determined by contacting the locating projects with bottom portions of corresponding locating grooves.

4. The mounting structure of movable manufacturing device according to claim 1, wherein;
   the positioning mechanism comprises,
   plural locating grooves as one of the floor side positioning members and the leg side positioning members, and
   plural locating legs as the other of the floor side positioning members and the leg side positioning members,
   orientations of the plural locating grooves differ from each other, and
   the placing position of the leg portion is determined by fitting the locating legs with corresponding locating grooves.

5. The mounting structure of movable manufacturing device according to claim 1, wherein;
   the coupling mechanism comprises,
   a hook catcher as one of the floor side coupling members and the leg side coupling members, and
   an anti-tip-hook as the other of the floor side coupling members and the leg side coupling members, and the leg portion are coupled with the fixing structure by engaging the anti-tip-hook with the hook catcher.

6. The mounting structure of movable manufacturing device according to claim 5, wherein;
the hook catcher of the coupling mechanism has a pin-shape,
the anti-tip-hook of the coupling mechanism has an approximately U-shape,
the pin-shaped hook catcher enters the anti-tip-hook in a state that an open-end of the anti-tip-hook orients toward the pin-shaped hook catcher, when the movable manufacturing device is put down, and
the leg portion are coupled with the fixing structure by that the anti-tip-hook changes orientation of the open-end of itself so as to refuse a rising up of the leg portion, when the leg portion is placed on the fixing structure.

7. The mounting structure of movable manufacturing device according to claim 5, wherein;
the hook catcher of the coupling mechanism has a coupling concave portion,
the anti-tip-hook of the coupling mechanism has a aduncate portion, a tip of which curves,
the leg portion are coupled with the fixing structure by that the anti-tip-hook rotates and the tip of the anti-tip-hook engages with the concave portion so as to refuse a rising up of the leg portion, when the movable manufacturing device is put down and the leg portion is placed on the fixing structure.

8. The mounting structure of movable manufacturing device according to claim 5, wherein;
the coupling mechanism further comprises an elongated hook operation lever coupled with the anti-tip-hook,
the anti-tip-hook rotates and engages with the hook catcher by moving the hook operation lever in one of longitudinal directions, and
the anti-tip-hook inversely rotates and releases engaging of the hook catcher by moving the hook operation lever in the other of longitudinal directions.

9. The mounting structure of movable manufacturing device according to claim 8, which is constructed so that,
the movable manufacturing device is lifted by a transport machine by inserting one or more transport arms of the transport machine to a space between the bottom plate of the movable manufacturing device and the floor, and rising the transport arms, and the movable manufacturing device is transported by a transport machine in the state of lifted,
the anti-tip-hook couples itself with the hook catcher by the action of pulling the transport arms out of the space between the bottom plate of the movable manufacturing device and the floor, after placing the leg portion of the movable manufacturing device on the fixing structure, and
the anti-tip-hook releases itself from the coupling with the hook catcher by the action of inserting the transport arm into the space between the bottom plate of the movable manufacturing device and the floor, to lift the movable manufacturing device placed on the fixing structure.

10. The mounting structure of movable manufacturing device according to claim 9, which is constructed so that,
the transport machine comprises a hook operation arm,
the anti-tip-hook couples itself with the hook catcher by the action of pulling the operation arms out of inside of the leg portion, and
the anti-tip-hook releases itself from the coupling with the hook catcher by the action of inserting the operation arm to inside of the leg portion.

11. The mounting structure of movable manufacturing device according to claim 8, wherein the coupling mechanism comprises a knob to manually move the hook operation lever in both of longitudinal directions.

12. The mounting structure of movable manufacturing device according to claim 1, wherein;
the stopper mechanism comprises,
a stopper groove provided by one of the fixing structure and the leg portion,
a stopper pin provided by the other of the fixing structure and the leg portion, and
the movable manufacturing device is horizontally moved to above the fixing structure, and stopped by that the stopper pin contacts with the stopper groove.

13. The mounting structure of movable manufacturing device according to claim 1, wherein;
the movable manufacturing device is lifted by a transport machine by inserting one or more transport arms of the transport machine to a space between the bottom plate of the movable manufacturing device and the floor, and rising the transport arms, and the movable manufacturing device is transported by a transport machine in the state of lifted, and
the stopper mechanism comprises a wheel catcher which is equipped by the fixing structure and is constructed so as to stop to transport the movable manufacturing device by making a wheel of the transport machine run on the wheel catcher.

14. A fixing structure installed on a floor to mount a movable manufacturing device, comprising:
a floor side positioning member which positions a leg side positioning member equipped by a leg portion to determine a placing position of the leg portion, when the movable manufacturing device is put down, and
a floor side coupling member which prevents the movable manufacturing device from falling, by coupling with a leg side coupling member equipped by the leg portion to make the leg portion be coupled with the fixing structure, when the leg portion is placed on the placing position,
a floor side stopping member to stop the movable manufacturing device approximately right above the placing position when the movable manufacturing device is carried above the fixing structure approximately horizontally.

15. A movable manufacturing device, a bottom portion of which is provided with a leg portion, wherein:
the leg portion comprises,
a leg side positioning member which is positioned by a floor side positioning member equipped by a fixing structure installed on a floor to determine a placing position of the leg portion, when the movable manufacturing device is put down, and
a leg side coupling member which prevents the movable manufacturing device from falling, by coupling with a floor side coupling member equipped by the fixing structure to make the leg portion be coupled with the fixing structure, when the leg portion is placed on the placing position,
a leg side stopping member to stop the movable manufacturing device approximately right above the placing position when the movable manufacturing device is carried above the fixing structure approximately horizontally.

16. A mounting structure of movable manufacturing device, comprising:

a fixing structure which is installed on a floor to mount the movable manufacturing device, a leg portion which is installed on a bottom plate of the movable manufacturing device to be placed on the fixing structure, a positioning mechanism which determines a placing position of the leg portion using a floor side positioning member equipped by the fixing structure and a leg side positioning member equipped by the leg portion, when the leg portion is moved downward from above to be placed on the fixing structure, a coupling mechanism which prevents the movable manufacturing device from falling, by coupling the leg portion with the fixing structure, using a floor side coupling member equipped by the fixing structure and leg side coupling member equipped by the leg portion, after the leg portion is placed on the placing position.

17. A mounting structure of movable manufacturing device, comprising:

a fixing structure which is installed on a floor to mount the movable manufacturing device, a leg portion which is installed on a bottom plate of the movable manufacturing device to be placed on the fixing structure, a stopper mechanism to stop the movable manufacturing device approximately right above a predetermined placing position of the fixing structure when the movable manufacturing device is carried above the fixing structure approximately horizontally, a coupling mechanism which prevents the movable manufacturing device from falling, by coupling the leg portion with the fixing structure, using a floor side coupling member equipped by the fixing structure and leg side coupling member equipped by the leg portion, after the leg portion is moved downward from above and placed on the placing position.

* * * * *